United States Patent [19]

Murkland et al.

[11] 4,417,265

[45] Nov. 22, 1983

[54] LATERAL PNP POWER TRANSISTOR

[75] Inventors: Judd R. Murkland, Santa Clara, Calif.; James S. Congdon, Maynard, Mass.

[73] Assignee: National Semiconductor Corporation, Santa Clara, Calif.

[21] Appl. No.: 247,700

[22] Filed: Mar. 26, 1981

[51] Int. Cl.³ .............................................. H01L 27/02
[52] U.S. Cl. ........................................ 357/51; 357/35; 357/68
[58] Field of Search .............................. 357/35, 51, 68

[56] References Cited

U.S. PATENT DOCUMENTS

| 3,609,460 | 9/1971 | Ollendorf | 357/35 |
| 3,879,745 | 4/1975 | Thamaratnam | 357/35 |
| 3,896,475 | 7/1975 | Bonis | 357/35 |
| 4,255,672 | 3/1981 | Ohno | 357/51 |

Primary Examiner—Martin H. Edlow
Attorney, Agent, or Firm—Gail W. Woodward; Paul J. Winters; Michael J. Pollock

[57] ABSTRACT

A high current lateral transistor suitable for intergrated circuit construction is fabricated in the form of a plurality of parallel transistors. Each transistor has an emitter surrounded by a closely confronting collector with the intervening semiconductor acting as the base region. Groups of parallel connected transistors are located on both sides of and distributed along a centerline which contains a number of diffused crossunder resistor elements. Each group of transistors is flanked on both sides by a base contact that is extended perpendicularly away from the centerline and connected by metalization to a resistor element. The resistor elements act to distribute the transistor base currents in a ballasting operation that promotes proper current distribution. Since the resistors are under the oxide the emitter and collector metalization can pass across the centerline region and parallel connect the individual transistors.

9 Claims, 5 Drawing Figures

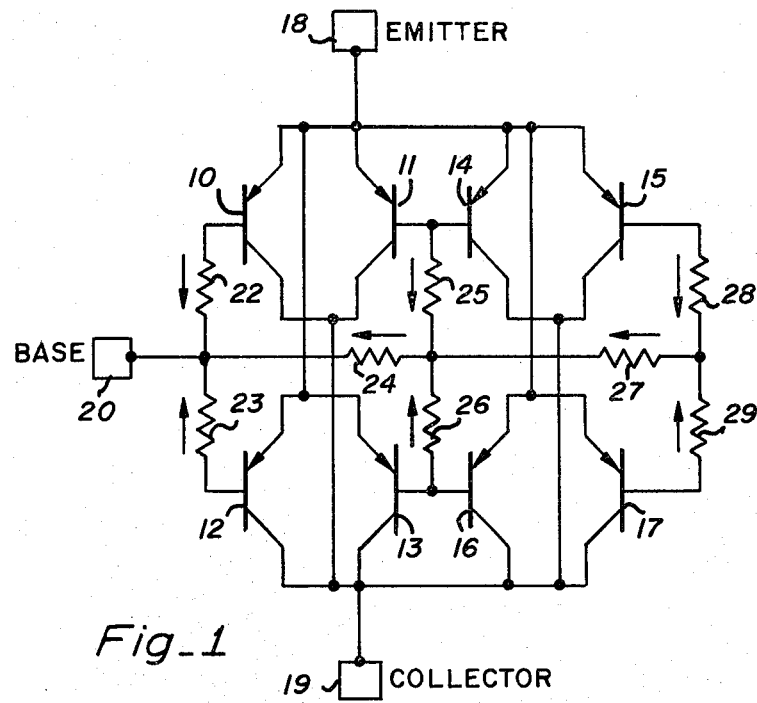
Fig_1
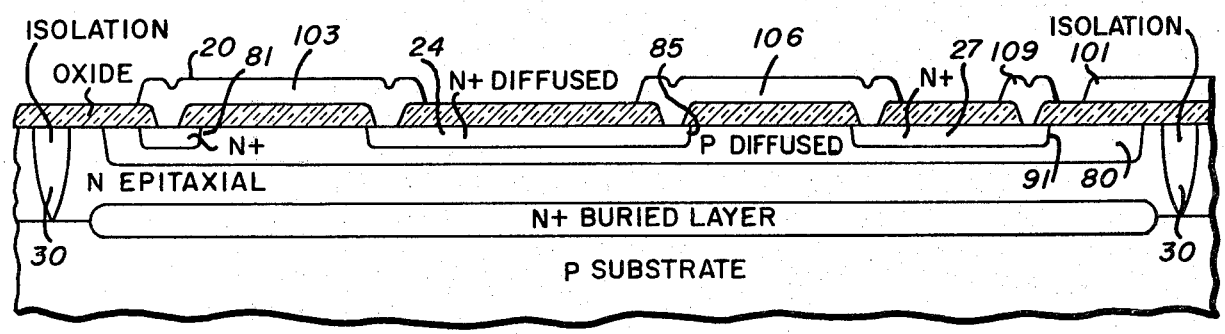
Fig_4
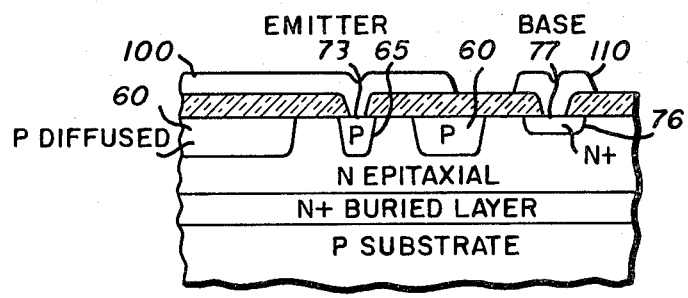
Fig_5

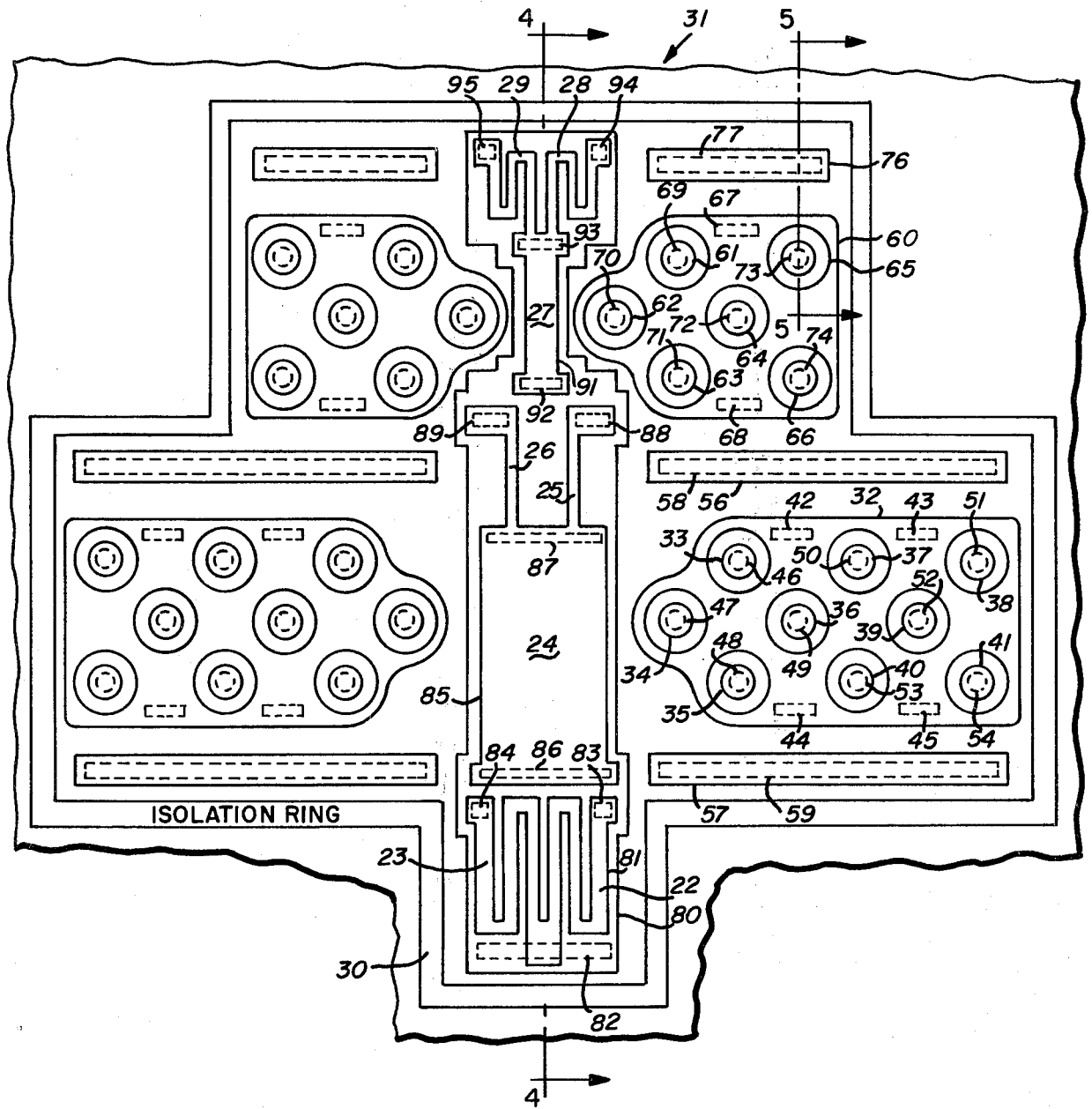
Fig_2

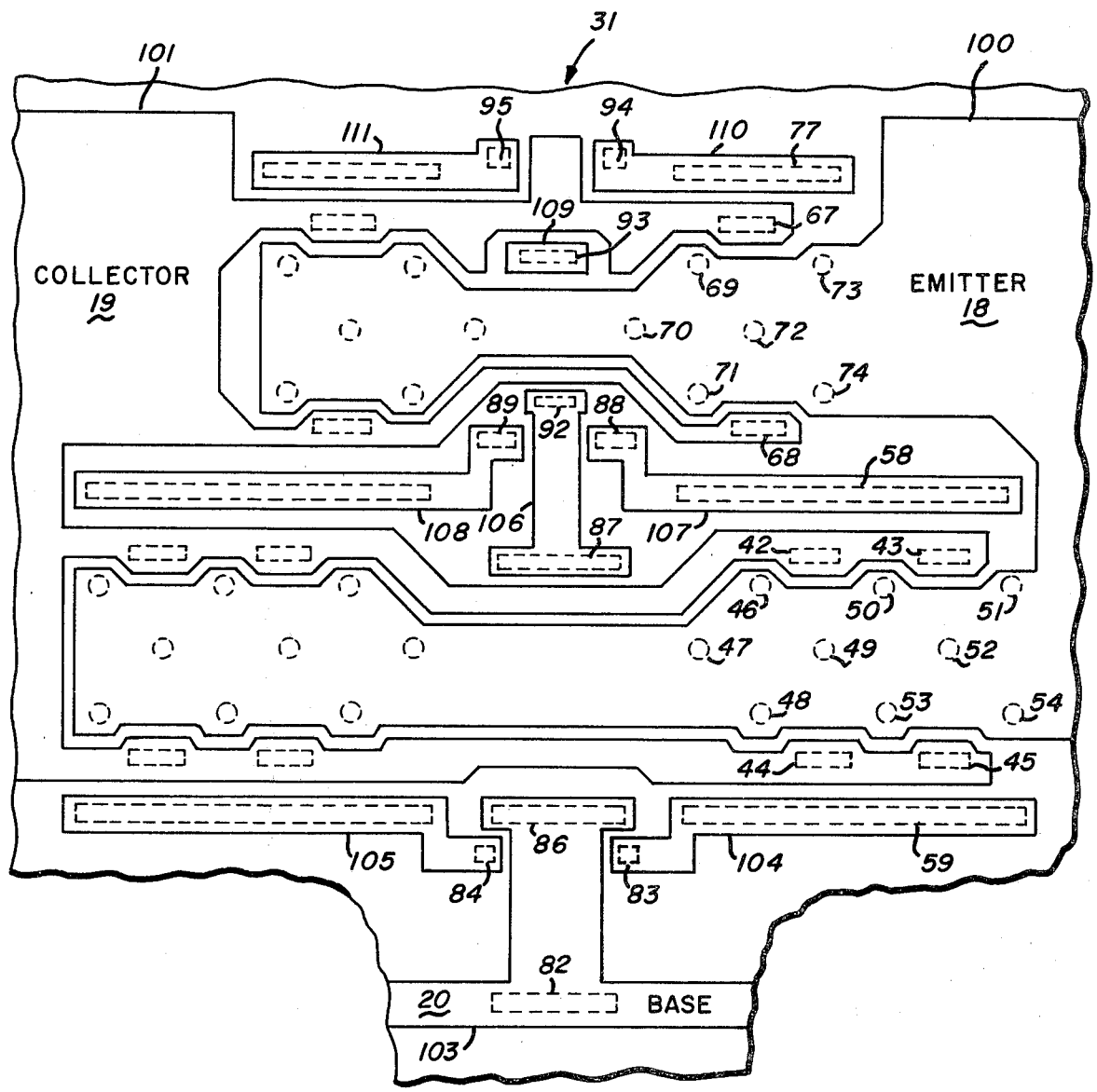
Fig_3

LATERAL PNP POWER TRANSISTOR

BACKGROUND OF THE INVENTION

In monolithic semiconductor intergrated circuit (IC) devices it has become common to include lateral PNP transistors along with NPN vertical transistors in bipolar device circuits. Typically when high power dissipation is a requirement large area NPN transistors are employed. In many cases a large area collector is used to confront a plurality of separate emitters with interdigitated base electrodes. Finger electrodes are usually used to contact the individual emitters and these may include resistive sections that act as emitter degeneration resistors, ensuring that the total current is properly distributed among the various elements. One very common IC device is the voltage regulator in which the pass transistor is the main power dissipating element. When a positive voltage is being regulated the collector of the NPN pass transistor is connected to the input terminal. This means that the minimum voltage drop available is in excess of a transistor $V_{BE}$. If a Darlington connection is used the limit is 2 $V_{BE}$. However, if a PNP pass transistor is used the emitter is connected to the input terminal and the drop can be lowered to one $V_{SAT}$ which is normally considerably lower than $V_{BE}$.

Another problem associated with the NPN positive voltage regulator is related to the IC version. As stated above the input terminal is connected to the collector of the pass transistor. In IC construction this would be a PN junction isolated region of substantial area. If such a device is inadvertently connected to a supply in the wrong polarity the isolation diode is forward biased. If the supply exceeds about 0.6 volt very heavy current can flow and destroy the IC. However, when the pass transistor is a PNP, the base represents the isolated region. If the P type emitter is connected to the wrong polarity supply, it becomes a reverse biased diode and no excess current will flow.

If a lateral transistor is to be constructed to have a high current gain, or Beta, it should have a large perimeter to area ratio. This requirement is satisfied by a relatively small circular emitter surrounded by a collector. When such a structure is to be employed in a device that is to be used for high power operation a large number of separate parallel connected devices will be needed. It is also clear that the base currents must be ballasted to overcome the natural tendency of such parallel connected structures to hog current. With a large number of elements the problem arises as to how the parallel connections are to be created along with the base current ballasting resistors. Thus far these problems have proven to be so formidable that high power PNP transistors have not been used to an appreciable extent, in IC's even though their availability is desired.

SUMMARY OF THE INVENTION

It is an object of the invention to create a high current lateral PNP power transistor suitable for use in a bipolar monolithic semiconductor IC.

It is a further object of the invention to parallel connect a plurality of lateral transistors to provide for high current operation of a PNP transistor for use in an IC.

It is a still further object of the invention to employ crossunder resistor elements in an IC to simultaneously ballast the current distribution in a high current PNP lateral transistor and allow large metal paths to interconnect the individual emitters and collectors.

These and other objects are achieved in the following structure. A plural transistor PNP transistor is created in a conventional bipolar monolithic semiconductor IC in a PN junction isolated region that includes a conductive buried layer. The transistors are located in groups or sections that are arrayed along both sides of a central region. Each section includes a single common collector diffusion and a plurality of emitters that are located inside holes in the collector diffusion. The central region includes a plurality of crossunder resistors that are controlled to provide the ballast resistors that are used to adjust the base current distributiion to the various sections. The crossunders involve a P type base diffusion for isolation and the resistors which are confined inside the base type isolation diffusion are N+ emitter diffusions. In the final metalization the emitters are connected in parallel by means of lateral metal stripes located on top of the planar oxide that exists over the central region. The collectors are parallel connected by other lateral stripes also located on top of the oxide. The various resistor elements are connected by metalization to ohmic base contacts located adjacent the common collector diffusions.

BRIEF DESCRIPTION OF THE DRAWING

FIG. 1 is a schematic diagram of the power transistor of the invention.

FIG. 2 shows the topography of the transistor of FIG. 1.

FIG. 3 shows the metalization of the IC structure of FIG. 2.

FIG. 4 is a cross section of the structure of FIG. 2 taken through the central region.

FIG. 5 is a cross section of a single transistor element of the FIG. 2 structure.

DESCRIPTION OF THE INVENTION

The lateral power transistor is shown in schematic form in FIG. 1. Eight separate transistors 10-17 are illustrated to show the principle. The emitters commonly connect to terminal pad 18 and the collectors commonly connect to terminal pad 19.

Base terminal 20 drives the transistor bases by way of ballast resistors 22-29. The values of the ballast resistors are adjusted to equalize the currents drawn by the various parallel-connected transistors. The arrows show the direction of current flow in the various resistors. The schematic itself nicely illustrates one of the most vexing problems in the design of multi-element devices. It can be seen that there are a number of places where the emitter and collector wiring must cross the base wiring. This makes it very difficult to parallel connect the elements and still ballast the base current drive to equalize conduction.

In FIG. 2 the topography of the invention is illustrated. It is to be understood that the drawing in FIG. 2 and subsequent Figures are illustrative only and not to scale. In FIG. 2 Fragment 31 illustrates a portion of an IC chip in which the transistor of the invention is contained. The planar oxide and metalization have been omitted for clarity. The dashed lines indicate those regions where the various diffusions are contacted by oxide cuts that will be further detailed hereinafter. Fragment 31 includes a conventional diffused isolation region 30 which acts to PN junction isolate a portion of top strata of the semiconductor wafer upon which the IC is fabricated. The structure also includes a conventional underlying buried layer (not shown) which acts to reduce lateral base resistance in the transistor.

In the following discussion it will be assumed that the conventional IC practice of a P type substrate wafer is employed with an N type epitaxial layer thereon to contain the active devices. When a P type diffusion is mentioned it will be of that normally used in making the base of an NPN vertical transistor. The N+ type diffusion will be that normally used to make an NPN transistor emitter. Such base diffusions are typically about three microns deep and the emitter diffusions about two microns deep. If desired enhanced device performance can be obtained by making the P type diffusions about 5 microns deep and of a doping density that is substantially higher concentration than that of the conventional NPN base.

P diffusion 32 comprises the collectors of a group of nine transistors, the emitters of which are represented by P diffusion 33–41. This group of transistor represent transistors 10 and 11 of FIG. 1. Diffusion 32 is contacted by oxide cuts at 42–45. Emitters 33–41 are contacted by oxide cuts at 46–54.

N+ diffusions 56 and 57 flank diffusion 32 and are contacted by cuts 58 and 59. These provide base connections to the lateral transistors that are associated with emitters 33–41.

P diffusion 60 provides the collectors for a group of six transistors in parallel that comprise transistors 14 and 15 of FIG. 1. The emitters are created by P diffusions 61–66. Contact cuts 67 and 68 provide for connections to diffusion 60 and cuts 69–74 provide for contact to emitters 60–66. N+ diffusion 76 provides through contact cut 77 one flanking base connection, while diffusion 56 provides the opposing base connection.

The transistors at the right side in FIG. 2 are mirrored on the left and an equivalent array of contact cuts is present. These make up transistors 12, 13, 16 and 17 of FIG. 1.

In the central region there is a P diffusion 80 which contains and isolates the various crossunder resistors. An N+ diffusion 81 is used to create resistors 22 and 23 which are contacted by cuts 82–84. It will be noted that contact cut 82 spans and exposes both diffusions 80 and 81. This means that the metalization, that will be described hereinafter, will provide a low impedance connection between the two diffusions, shorting them together at a point that will comprise base input terminal 20 of FIG. 1.

Resistor 24 is fabricated from N+ diffusion 85 and is contacted at cuts 86 and 87. This same diffusion creates resistors 25 and 26 which are contacted at 88 and 89.

Resistor 27 is fabricated from N+ diffusion 91 and is contacted at 92 and 93. This same diffusion is used to create resistors 28 and 29 which are contacted at 94 and 95.

FIG. 3 shows the metalization that would be located on top of the planar oxide that would result from the aforementioned diffusions and would complete the circuit shown in FIG. 1. The contact cuts are shown in dashed outline (as they were in FIG. 2) and represent where the metalization would contact the silicon. Where such metal to silicon contact does occur an ohmic connection is created.

It can be seen that metalization pattern 100 comprises emitter pad 18 of FIG. 1. It joins the emitters together at contacts 69–74, 46–54, and the unnumbered emitter cuts on the left hand side of the drawing.

Metalization pattern 101 comprises the collector pad 19 of FIG. 1. It joins with the silicon at contact cuts 42–45, 67, 68, and the equivalent unnumbered cuts on the left hand side of the drawing.

Metalization pattern 103 comprises base terminal pad 20 of FIG. 1. It joins diffusion 80 to diffusion 81 at contact cut 82. Via contact cuts 82 and 86 metalization 103 also joins resistors 22–24 to pad 20.

Metalizations patterns 104 and 105 connect respectively resistors 22 and 23 to the bases of transistors 10 and 12 of FIG. 1.

Metalization pattern 106 connects resistor 24 to resistor 27 by way of contact cuts 87 and 92.

Metalization patterns 107 and 108 connect respectively resistors 25 and 26 to the bases of transistors 11, 14 and 13, 16.

Metalization pattern 109 terminates resistor 27 at contact cut 93.

Metalization patterns 110 and 111 connect respectively resistors 28 and 29 to the bases of transistors 15 and 17.

FIGS. 4 and 5 represent cross sections of the semiconductor chip taken, as shown in FIG. 2, respectively at the centerline of Fragment 31 and across one lateral transistor element.

From FIGS. 1, 2 and 4 it can be seen that the N+ crossunder resistors 22–29 are located in a P type isolation region 80. When current flows in the crossunder resistors the N+ diffusions are either at the same potential as region 80 or positive with respect thereto. Also since regin 80 is connected to terminal 20 which is one $V_{BE}$ negative with respect to terminal 18 it will normally be reverse biased with respect to the epitaxial layer.

FIG. 5 shows that the heavily doped N+ "Buried Layer" which offers a low impedance path for base current, considering that the vertical distance from the P diffusions to the N+ is 1/10 to 1/100 the horizontal distance between diffusions.

From the foregoing it can be seen that a composite transistor consisting of a plurality of individual parallel connected elements is disclosed. The current distribution is adjusted by crossunder ballast resistors connected to the transistor base terminals. The parallel connection is accomplished by using three parallel rows of individual transistors to make up a group. The outer rows connect directly to the flanking base connections while the central row is divided equally between the other two rows. While the rows are shown as being two and three elements long, involving six and nine elements respectively for the groups involved, more transistors could be employed. Furthermore while four groups are shown (two on each side of the centerline) more could be employed. For each pair of groups added an additional array of three resistors would be employed along the centerline.

EXAMPLE

A structure of the kind shown in the drawing was fabricated into IC form as described using conventional processing. The long groups which were closest to input terminal 20 each contained twenty four elements and the short groups, which were located between the emitemitter and collector pads, each contained eighteen elements. Thus there were a total eighty four elements. The individual emitters were approximately 0.5 mil in diameter and the entire power transistor array occupied less than 900 square mils or about one third of the area of a small IC chip.

The ballasting resistors employed had the following resistance values:

| Resistor | Value (ohms) |
| --- | --- |
| 22 | 50 |
| 23 | 50 |
| 24 | 3.3 |
| 25 | 19 |
| 26 | 19 |
| 27 | 5.3 |
| 28 | 32 |
| 29 | 32 |

The resulting PNP transistor could dissipate about 3 watts and betas of 25-30 at 150 ma, and 15-20 at 250 ma.

The invention has been described and a working example detailed. When a person skilled in the art reads the foregoing, alternatives and equivalents within the spirit and intent of the invention will become apparent. For example, while a structure involving a P type substrate and an N type epitaxial layer is shown, all of the conductivity types could be complemented. Accordingly it is intended that the scope of the invention be limited only by the following claims.

We claim:

1. A lateral power transistor suitable for construction into a semiconductor substrate having a planar surface oxide, said transistor comprising:
a plurality of parallel connecting individual transistor elements arrayed in groups of elements located within the surface of a semiconductor having one conductivity type, each element having an emitter of the opposite semiconductor conductivity type confronted by a spaced apart collector of said opposite conductivity type, wherein the space between said emitter and collector constitutes a base region;
said groups being located on opposite sides of and disposed along a center region;
means adjacent to each of said groups for making distributed contact to said transistor base regions therein,
crossunder resistance means located within said center region for making resistance connections to said distributed contact means whereby the base currents in said transistor elements are ballasted and equalized; and
metalization located on top of said semiconductor oxide for interconnecting said transistor elements into a unitary device in which said metalization can be run directly over said center region thereby permitting said groups to be parallel connected without interfering with said base connections.

2. The transistor of claim 1 wherein said groups are contained within a single PN junction isolated region of semiconductor material.

3. The transistor of claim 2 wherein a conductive buried layer underlies said isolated region and said distributed contact means makes a low resistance connection thereto.

4. The transistor of claim 2 wherein said crossunder resistance means comprises a first diffused region of semiconductor of a conductivity type opposite to that of said isolated region and a second diffused region having a conductivity type the same as said isolated region confined within said first diffused region and contoured to create said resistance connections.

5. The transistor of claim 4 wherein said first and second diffused regions are connected together at one end which comprises the base terminal connection for said transistor.

6. A composite lateral transistor suitable for incorporation into a bipolar monolithic semiconductor integrated circuit, said composite transistor including a plurality of individual lateral transistor elements connected together to provide a common base feed connection, a common collector terminal and a common emitter terminal, said composite transistor comprising:
a semiconductor substrate having a planar oxide thereon; a plurality of individual lateral transistors fabricated into the surface of said semiconductor, said plurality being arrayed in at least two groups located on opposite sides of a centerline region, each group including a plurality of rows of individual lateral transistors,
a resistive element fabricated in the surface of said semiconductor substrate in said centerline region and including separate resistor elements for each of said groups, one end of said resistive region acting to provide said common base feed connection and
metalization on top of said planar oxide extending across said centerline region to parallel interconnect the emitters and collectors of said individual lateral transistors to provide said common emitter and collector terminals.

7. The transistor of claim 6 wherein said resistive element comprises a diffused region contoured to provide the desired resistance value.

8. The transistor of claim 7 wherein said resistive region comprises a first diffused region having a conductivity type opposite that of said semiconductor substrate and a second diffused region inside said first diffused region and said second diffused region having the same conductivity type as said semiconductor.

9. The transistor of claim 8 wherein said first and second diffused regions are connected together to provide said common base feed connection.

* * * * *